United States Patent
Park et al.

(10) Patent No.: US 10,418,574 B2
(45) Date of Patent: Sep. 17, 2019

(54) ORGANIC LIGHT EMITTING DIODE AND ORGANIC LIGHT EMITTING DIODE DISPLAY DEVICE COMPRISING THE SAME

(71) Applicant: SAMSUNG DISPLAY CO., LTD., Yongin-si, Gyeonggi-do (KR)

(72) Inventors: Heungsu Park, Yongin-si (KR); Jihwan Yoon, Yongin-si (KR); Sangwoo Lee, Yongin-si (KR); Jaehoon Hwang, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/937,070

(22) Filed: Mar. 27, 2018

(65) Prior Publication Data

US 2018/0287084 A1    Oct. 4, 2018

(30) Foreign Application Priority Data

Mar. 28, 2017   (KR) ...................... 10-2017-0038978

(51) Int. Cl.
*H01L 51/50* (2006.01)
*H01L 27/32* (2006.01)
*H01L 51/52* (2006.01)

(52) U.S. Cl.
CPC ...... *H01L 51/5004* (2013.01); *H01L 27/3262* (2013.01); *H01L 27/3265* (2013.01); *H01L 51/5056* (2013.01); *H01L 51/5072* (2013.01); *H01L 51/5092* (2013.01); *H01L 51/5206* (2013.01); *H01L 51/5221* (2013.01); *H01L 2251/552* (2013.01)

(58) Field of Classification Search
CPC ............. H01L 27/3246; H01L 51/5271; H01L 27/3272; H01L 27/3211; H01L 51/56; H01L 27/32; H05B 33/145; H05B 33/24; G09F 9/30
USPC .......................................................... 257/40
See application file for complete search history.

(56) References Cited

U.S. PATENT DOCUMENTS

2015/0069352 A1*  3/2015  Kim ................... H01L 51/5004
                                                            257/40
2016/0307977 A1   10/2016  Liu et al.

FOREIGN PATENT DOCUMENTS

KR   10-2012-0125771 A   11/2012
KR   10-2013-0115027 A   10/2013

\* cited by examiner

*Primary Examiner* — Karen Kusumakar
*Assistant Examiner* — Adam S Bowen
(74) *Attorney, Agent, or Firm* — Lee & Morse, P.C.

(57) ABSTRACT

An organic light emitting element includes a first electrode; a first organic layer on the first electrode; a second organic layer on the first organic layer; a second electrode on the second organic layer; and a mixed layer between the first organic layer and the second organic layer. A gap between a highest occupied molecular orbital (HOMO) energy level of the first organic layer and a lowest unoccupied molecular orbital (LUMO) energy level of the second organic layer may be in a range from about 1.35 eV to about 1.70 eV. The mixed layer may emit light having a wavelength in a range from about 740 nm to about 950 nm by exciplex.

19 Claims, 6 Drawing Sheets

ORGANIC LIGHT EMITTING DIODE AND ORGANIC LIGHT EMITTING DIODE DISPLAY DEVICE COMPRISING THE SAME

CROSS-REFERENCE TO RELATED APPLICATION

Korean Patent Application No. 10-2017-0038978, filed on Mar. 28, 2017, in the Korean Intellectual Property Office, and entitled: "Organic Light Emitting Diode and Organic Light Emitting Diode Display Device Comprising the Same," is incorporated by reference herein in its entirety.

1. Field

Embodiments relate to an organic light emitting diode ("OLED") and an OLED display device including the OLED.

2. Description of the Related Art

Display devices may be classified into liquid crystal display ("LCD") devices, organic light emitting diode ("OLED") display devices, plasma display panel ("PDP") devices, electrophoretic display devices, and the like based on a light emitting scheme thereof.

Among these, OLED display devices are garnering attention as an ideal display device of the next generation because they have excellent display characteristics such as a contrast ratio and a response time and are easy to be implemented as flexible display devices.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Embodiments are directed to an organic light emitting element that includes: a first electrode; a first organic layer on the first electrode; a second organic layer on the first organic layer; a second electrode on the second organic layer; and a mixed layer between the first organic layer and the second organic layer. A gap between a highest occupied molecular orbital (HOMO) energy level of the first organic layer and a lowest unoccupied molecular orbital (LUMO) energy level of the second organic layer may be in a range from about 1.35 eV to about 1.70 eV. The mixed layer may emit light having a wavelength in a range from about 740 nm to about 950 nm by exciplex.

The first organic layer, the second organic layer, and the mixed layer may not include a dopant.

The mixed layer may have a concentration gradient so that a concentration value of the second organic material increases along a direction from the first organic layer toward the second organic layer and a concentration value of the first organic material increases along a direction from the second organic layer toward the first organic layer.

The first organic layer may be a hole transport layer.

The first organic layer may be a resonance auxiliary layer.

The organic light emitting element may further include a third organic layer between the first electrode and the first organic layer.

The highest occupied molecular orbital energy level of the first organic layer may be lower than a highest occupied molecular orbital energy level of the third organic layer.

The second organic layer may be an electron transport layer.

The organic light emitting element may further include a fourth organic layer between the second organic layer and the second electrode.

The lowest unoccupied molecular orbital energy level of the second organic layer may be higher than a lowest unoccupied molecular orbital energy level of the fourth organic layer According to an example embodiment, an organic light emitting display device includes: a substrate; a driving circuit portion on the substrate; and an organic light emitting element on the driving circuit portion. The organic light emitting element includes: a first electrode; a first organic layer on the first electrode; a second organic layer on the first organic layer; a second electrode on the second organic layer; and a mixed layer between the first organic layer and the second organic layer. A gap between a highest occupied molecular orbital energy level of the first organic layer and a lowest unoccupied molecular orbital energy level of the second organic layer is in a range from about 1.35 eV to about 1.70 eV. The mixed layer emits light having a wavelength in a range from about 740 nm to about 950 nm by exciplex.

The first organic layer, the second organic layer, and the mixed layer may not include a dopant.

The mixed layer may have a concentration gradient so that a concentration value of the second organic material increases along a direction from the first organic layer toward the second organic layer and a concentration value of the first organic material increases along a direction from the second organic layer toward the first organic layer.

The organic light emitting display device may further include a third organic layer between the first electrode and the first organic layer.

The highest occupied molecular orbital energy level of the first organic layer is lower than a highest occupied molecular orbital energy level of the third organic layer.

The organic light emitting display device may further include a fourth organic layer between the second organic layer and the second electrode.

The lowest unoccupied molecular orbital energy level of the second organic layer may be higher than a lowest unoccupied molecular orbital energy level of the fourth organic layer The driving circuit portion may include: a gate line on the substrate; a data line crossing the gate line; and a thin film transistor connected to the gate line and the data line.

The organic light emitting display device may further include a thin film encapsulation layer on the second electrode. The thin film encapsulation layer may include: at least one inorganic layer; and at least one organic layer arranged alternately with the at least one inorganic layer.

The organic light emitting display device may further include: a capping layer on the second electrode; a filler on the capping layer; and an encapsulation substrate on the filler.

BRIEF DESCRIPTION OF THE DRAWINGS

Features will become apparent to those of skill in the art by describing in detail example embodiments with reference to the attached drawings in which.

DETAILED DESCRIPTION

Figure 1:
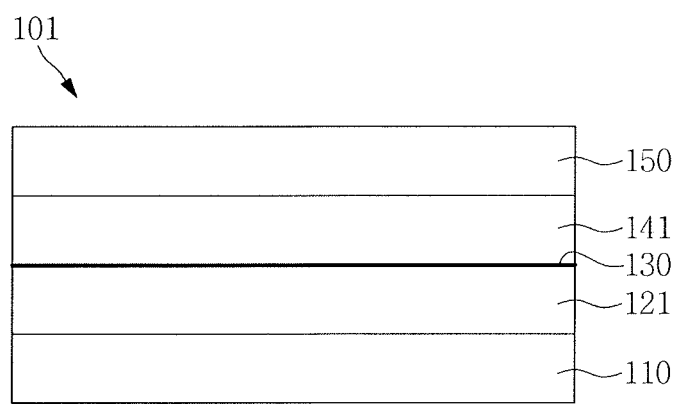
FIG. 1 illustrates a cross-sectional view schematically illustrating an organic light emitting diode ("OLED") according to a first example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a first example embodiment will be described with reference to FIGS. 1, 2, and 3.

Figure 2:
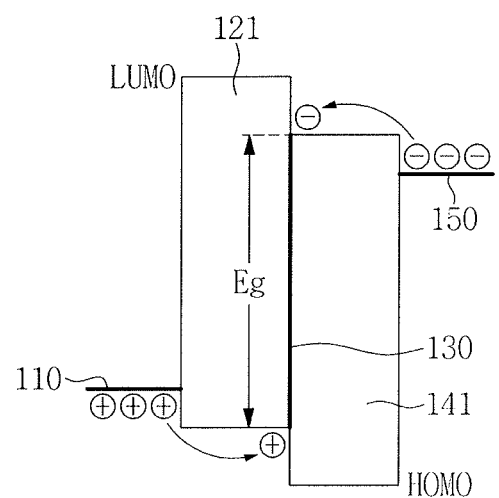
FIG. 2 illustrates a band diagram of an OLED according to a first example embodiment.
Figure 3:
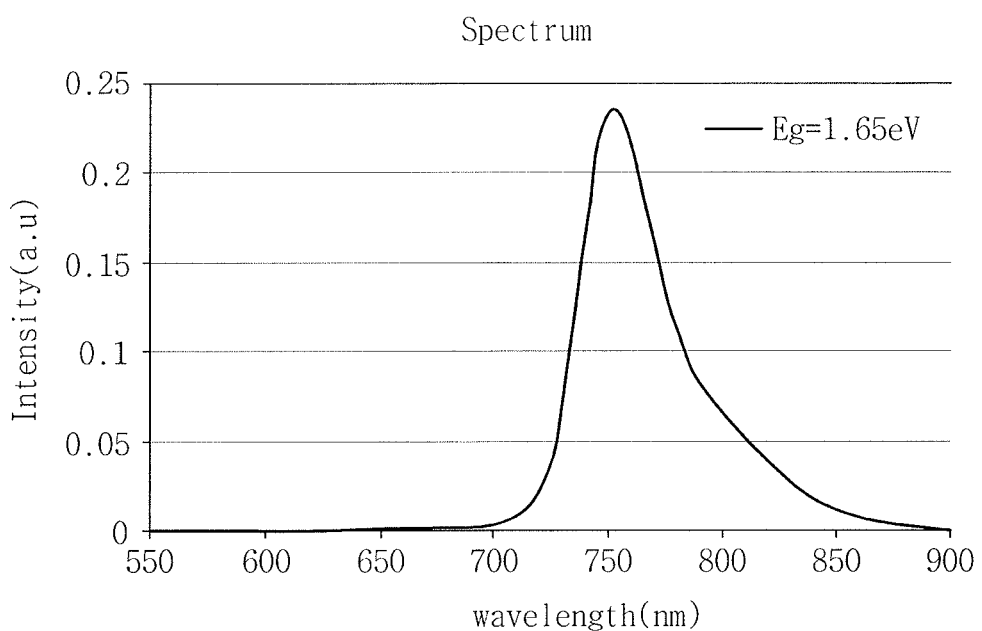
FIG. 3 illustrates an emission spectrum of an OLED according to a first example embodiment.

FIG. 1 is a cross-sectional view schematically illustrating an organic light emitting diode ("OLED") according to a first example embodiment, FIG. 2 is a band diagram of an OLED according to a first example embodiment, and FIG. 3 is an emission spectrum of an OLED according to a first example embodiment.

Referring to FIGS. 1 and 2, an OLED 101 according to a first example embodiment includes a first electrode 110, a first organic layer 121 on the first electrode 110, a second organic layer 141 on the first organic layer 121, a second electrode 150 on the second organic layer 141, and a mixed layer 130 of a first organic material and a second organic material between the first organic layer 121 and the second organic layer 141.

According to a first example embodiment, the first electrode 110 is an anode and the second electrode 150 is a cathode. The first electrode 110 may be, for example, a translucent electrode having light transmittance or a reflective electrode having light reflectivity. The second electrode 150 may be, for example, a semi-translucent electrode having semi-light transmittance or a reflective electrode having light reflectivity.

The first organic layer 121 may be, for example, a hole transport layer having hole transporting properties. For example, the first organic material may include one of a carbazole-based derivative such as N-phenylcarbazole and polyvinylcarbazole, a fluorene-based derivative, N,N'-bis(3-methylphenyl)-N,N'-diphenyl-[1,1-biphenyl]-4,4'-diamine (TPD), a triphenylamine derivative such as 4,4',4''-tris(N-carbazolyl)triphenylamine) (TCTA), N,N'-di(1-naphthyl)-N,N'-diphenylbenzidine (NPB), and/or 4,4'-cyclohexylidene bis[N,N-bis(4-methylphenyl)benzenamine] (TAPC), for example, but example embodiments are not limited thereto. In an implementation, the OLED 101 according to a first example embodiment may further include a hole injection layer between the first electrode 110 and the first organic layer 121.

The second organic layer 141 may be, for example, an electron transport layer having electron transporting properties. For example, the second organic layer 141 may include one of: tris (8-hydroxyquinolinato) aluminum (Alq3), 1,3,5-Tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD). Bis(2-methyl-8-quinolinolato-N1,O8)-(1,1'-Biphenyl-4-olato)aluminum (BAlq), beryllium bis (benzoquinolin-10-olate) (Bebq2), and/or 9,10-di (naphthalene-2-yl)anthracene (ADN), but example embodiments are not limited thereto. In an implementation, the OLED 101 according to a first example embodiment may further include an electron injection layer between the second organic layer 141 and the second electrode 150.

The mixed layer 130 includes the first organic material and the second organic material. The mixed layer 130 according to a first example embodiment is not formed in a separate process from a process in which the first and second organic layers 121 and 141 are formed. The mixed layer 130 refers to a medium layer which is formed by mixing the first organic material and the second organic material in a process of sequentially depositing the first organic layer 121 and the second organic layer 141. Accordingly, the mixed layer 130 may have a concentration gradient so that a concentration value of the second organic material increases along a direction from the first organic layer 121 toward the second organic layer 141 and a concentration value of the first organic material increases along a direction from the second organic layer 141 toward the first organic layer 121. The mixed layer 130 according to a first example embodiment is described as a boundary region between the first organic layer 121 and the second organic layer 141, but example embodiments are not limited thereto. The mixed layer 130 may refer to only an interfacial surface between the first organic layer 121 and the second organic layer 141.

Holes and electrons are injected from the first and second electrodes 110 and 150 into the mixed layer 130 through the first and second organic layers 121 and 141, respectively, and an exciplex is formed by combination of the injected holes and electrons. When the exciplex falls from an excited state to a ground state, light emission occurs.

An exciplex generally refers to a new complex which appears as one of two different molecules in an excited state and the other of the two different molecules in a ground state are combined. The exciplex in the present example embodiment may refer to an exciton which is formed by combination of holes and electrons in the mixed layer 130 between two organic layers 121 and 141 when the two organic layers 121 and 141 are stacked.

As shown in FIG. 2, the first organic layer 121 and the second organic layer 141 have different energy bands. Generally, the molecular binding force of an organic material is relatively considerably weak compared to ionic bonding, etc., and the electron energy level of the organic layer is quantized and appears as an energy band having a predetermined gap. The energy band of the organic layer may be defined by a gap between a lowest unoccupied molecular orbital ("LUMO") energy level and a highest occupied molecular orbital ("HOMO") energy level.

When a predetermined electric field is applied to the OLED 101, holes existing in the first electrode 110 may move to an adjacent layer by the electric field. In the present example embodiment, a higher electric field is required as a gap between HOMO energy levels of adjacent layers increases. Thus, the HOMO energy level is related to movement of holes. Due to the applied electric field, holes may move from a layer having a higher HOMO energy level to a layer having a lower HOMO energy level.

The first organic layer 121 according to a first example embodiment has a HOMO energy level lower than a work function of the first electrode 110. Accordingly, the holes may move from the first electrode 110 to the first organic layer 121 by the applied electric field.

When a predetermined electric field is applied to the OLED 101, electrons existing in the second electrode 150 may move to an adjacent layer by the electric field. In the present example embodiment, a higher electric field is required as a gap between LUMO energy levels of adjacent layers increases. Thus, the LUMO energy level is related to movement of electrons. Due to the applied electric field, electrons may move from a layer having a lower LUMO energy level to a layer having a higher LUMO energy level.

The second organic layer 141 according to a first example embodiment has a LUMO energy level higher than a work function of the second electrode 150. Accordingly, electrons may move from the second electrode 150 to the second organic layer 141 by the applied electric field.

Subsequently, holes having a HOMO energy level of the first organic layer 121 and electrons having a LUMO energy level of the second organic layer 141 are combined in the mixed layer 130 to form an exciplex. When the exciplex falls from an excited state to a ground state, light emission occurs. Thus, light emission occurs at a boundary region between the first organic layer 121 having hole transporting properties and the second organic layer 141 having electron transporting properties.

Generally, an energy E of a photon satisfies the following equation 1.

$$E=h\nu=hc/\lambda \qquad \text{[Equation 1]}$$

In Equation 1, h denotes the Planck's constant, v denotes a frequency of light, c denotes a speed of the light, and λ denotes a wavelength of the light.

In the present example embodiment, an energy E in Equation 1 may correspond to a gap Eg between the HOMO energy level of the first organic layer 121 and the LUMO energy level of the second organic layer 141. Accordingly, the wavelength λ of the light emitted from the mixed layer 130 satisfies the following equation 2.

$$\lambda=1240/Eg \qquad \text{[Equation 2]}$$

Thus, the wavelength λ of the light emitted by the exciplex in the mixed layer 130 may be determined by the gap Eg between the HOMO energy level of the first organic layer 121 and the LUMO energy level of the second organic layer 141.

The gap Eg between the HOMO energy level of the first organic layer 121 and the LUMO energy level of the second organic layer 141 according to a first example embodiment may be in a range from about 1.35 eV to about 1.70 eV. Accordingly, the mixed layer 130 may emit light having a wavelength in a range from about 740 nm to about 950 nm. Thus, the mixed layer 130 may emit light in a near-infrared wavelength range.

For example, as illustrated in FIG. 3, when the gap Eg between the HOMO energy level of the first organic layer 121 and the LUMO energy level of the second organic layer 141 is about 1.65 eV, the mixed layer 130 may emit light having a maximum wavelength of about 750 nm.

Accordingly, the OLED 101 according to a first example embodiment may emit light having a wavelength λ in a range from about 740 nm to about 950 nm, without separately including a dopant and a light emitting layer including the dopant.

Hereinafter, a second example embodiment will be described with reference to FIG. 4. The descriptions of the configurations the same as those of the first example embodiment will be omitted for the sake of convenience of explanation.

Figure 4:
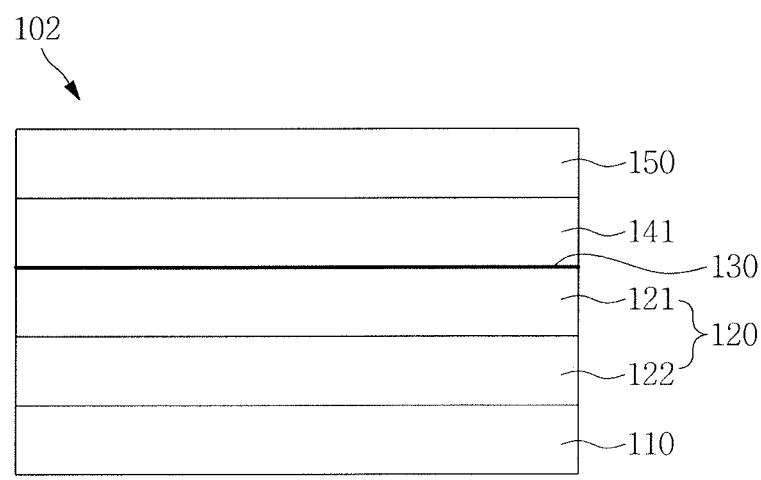
FIG. 4 illustrates a cross-sectional view schematically illustrating an OLED according to a second example embodiment.

Referring to FIG. 4, an OLED 102 according to a second example embodiment further includes a third organic layer 122 between the first electrode 110 and the first organic layer 121, as compared to the OLED 101 according to the first example embodiment.

The third organic layer 122 may be, for example, a hole transport layer having hole transporting properties. Thus, the OLED 102 according to a second example embodiment may include a hole transport layer 120 having a multi-layered structure including the first organic layer 121 and the third organic layer 122.

In the present example embodiment, the first organic layer 121 may serve as a hole transport layer and also as a resonance auxiliary layer at a time. Thus, the first organic layer 121 serving as the resonance auxiliary layer may adjust a distance between the first electrode 110 and a second electrode 150.

According to the present example embodiment, the OLED 102 includes a multi-layered structure, whereby light generated in the mixed layer 130 is emitted through the multi-layered structure. In the present example embodiment, when optical resonance occurs between two layers, an energy of the light increases, and the light having an increased energy may easily pass through the multi-layered structure and be emitted to the outside. A structure which allows the light to resonate between two layers is called a resonance structure, and a distance between the two layers where resonance occurs is called a resonance distance. The resonance distance may vary depending on a wavelength λ of the light emitted from the mixed layer 130. Accordingly, the OLED 102 according to a second example embodiment may adjust the resonance distance depending on the wavelength λ of the light by adjusting a thickness of the first organic layer 121.

The OLED 102 according to the second example embodiment is described as including the third organic layer 122 which is the hole transport layer, but example embodiments are not limited thereto. For example, the third organic layer 122 may be a hole injection layer.

Hereinafter, a third example embodiment will be described with reference to FIG. 5. The descriptions of the configurations the same as those of the first example embodiment will be omitted for the sake of convenience of explanation.

Figure 5:
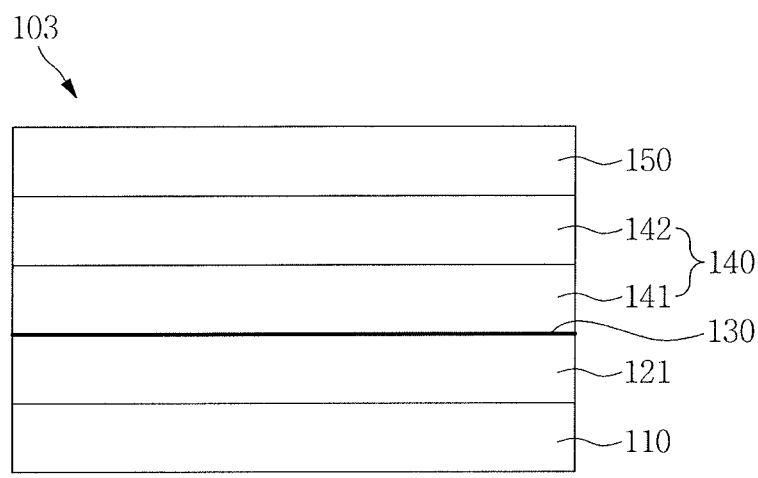
FIG. 5 illustrates a cross-sectional view schematically illustrating an OLED according to a third example embodiment.

Referring to FIG. 5, an OLED 103 according to a third example embodiment further includes a fourth organic layer 142 between the second organic layer 141 and the second electrode 150, as compared to the OLED 101 according to the first example embodiment.

The fourth organic layer 142 may be an electron transport layer having electron transporting properties. Thus, the OLED 103 according to the third example embodiment may include a multi-layered electron transport layer 140 including the second organic layer 141 and the fourth organic layer 142.

In the present example embodiment, the second organic layer 141 may serve as an electron transport layer and also as a buffer layer at a time. Thus, the second organic layer 141 which serves as a buffer layer may adjust a gap Eg between a HOMO energy level of a first organic layer 121 and a LUMO energy level of the second organic layer 141. The gap Eg between the HOMO energy level of the first organic layer 121 and the LUMO energy level of the second organic layer 141 may be in a range from about 1.35 eV to about 1.70 eV.

The OLED 103 according to the third example embodiment is described as including the fourth organic layer 142 which is an electron transport layer, but example embodiments are not limited thereto. For example, the fourth organic layer 142 may be an electron injecting layer.

Hereinafter, a fourth example embodiment will be described with reference to FIGS. 6 and 7. The descriptions of the configurations the same as those of the first, second, and third example embodiments will be omitted for the sake of convenience of explanation.

Figure 6:
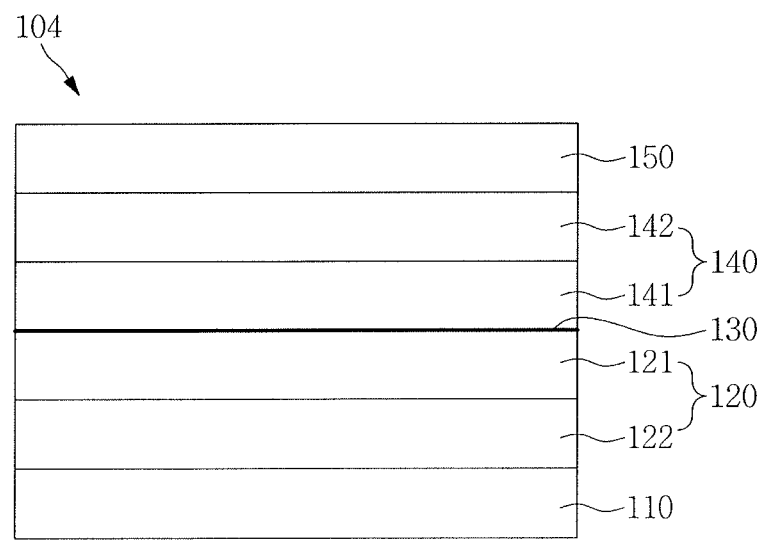
FIG. 6 illustrates a cross-sectional view schematically illustrating an OLED according to a fourth example embodiment.
Figure 7:
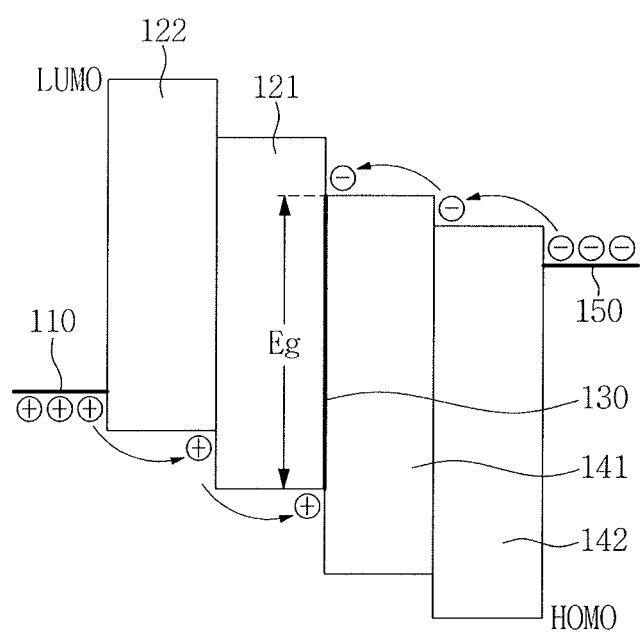
FIG. 7 illustrates a band diagram of an OLED according to a fourth example embodiment.

FIG. 6 is a cross-sectional view schematically illustrating an OLED according to a fourth example embodiment, and FIG. 7 is a band diagram of an OLED according to a fourth example embodiment.

Referring to FIGS. 6 and 7, an OLED 104 according to a fourth example embodiment, as compared to the OLED 101 according to the first example embodiment, further includes a third organic layer 122 between the first electrode 110 and the first organic layer 121, and a fourth organic layer 142 between the second organic layer 141 and the second electrode 150.

The third organic layer 122 and the fourth organic layer 142 may be a hole transport layer and an electron transport layer, respectively. Thus, the OLED 104 according to a fourth example embodiment may include a hole transport layer 120 having a multi-layered structure and an electron transport layer 140 having a multi-layered structure.

According to the present example embodiment, a HOMO energy level of the first organic layer 121 is lower than a HOMO energy level of the third organic layer 122, and a LUMO energy level of the second organic layer 141 is higher than a LUMO energy level of the fourth organic layer 142.

According to the present example embodiment, as illustrated in FIG. 7, the third organic layer 122 according to the fourth example embodiment has a HOMO energy level lower than a work function of the first electrode 110, and the first organic layer 121 has a HOMO energy level lower than that of the third organic layer 122. Accordingly, holes may move, due to the applied electric field, from the first electrode 110 to the third organic layer 122 and from the third organic layer 122 to the first organic layer 121 in stages.

In addition, according to the fourth example embodiment, the fourth organic layer 142 has a LUMO energy level higher than a work function of the second electrode 150, and the second organic layer 141 has a LUMO energy level higher than that of the fourth organic layer 142. Accordingly, electrons may move, due to the applied electric field, from the second electrode 150 to the fourth organic layer 142 and from the fourth organic layer 142 to the second organic layer 141 in stages.

Next, electrons having the HOMO energy level of the first organic layer 121 and electrons having the LUMO energy level of the second organic layer 141 are combined in a mixed layer 130 to form an exciplex. When the exciplex falls from an excited state to a ground state, light emission occurs.

A gap Eg between the HOMO energy level of the first organic layer 121 and the LUMO energy level of the second organic layer 141 according to a fourth example embodiment may be in a range from about 1.35 eV to about 1.70 eV. Accordingly, the mixed layer 130 may emit light having a wavelength in a range from about 740 nm to about 950 nm due to the exciplex.

Figure 8:
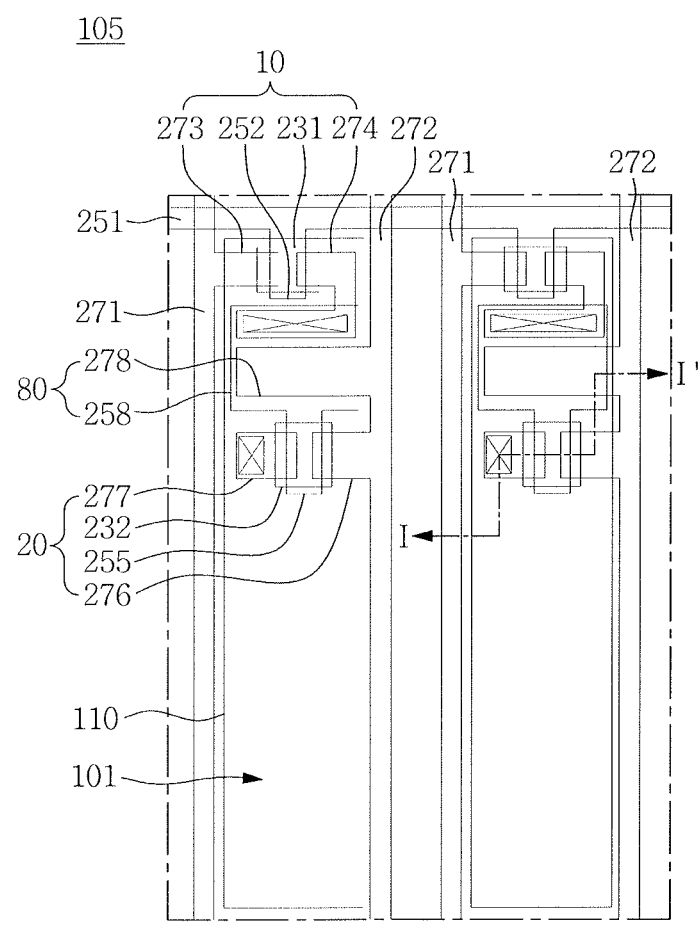
FIG. 8 illustrates a plan view illustrating an OLED display device according to a fifth example embodiment.
Figure 9:
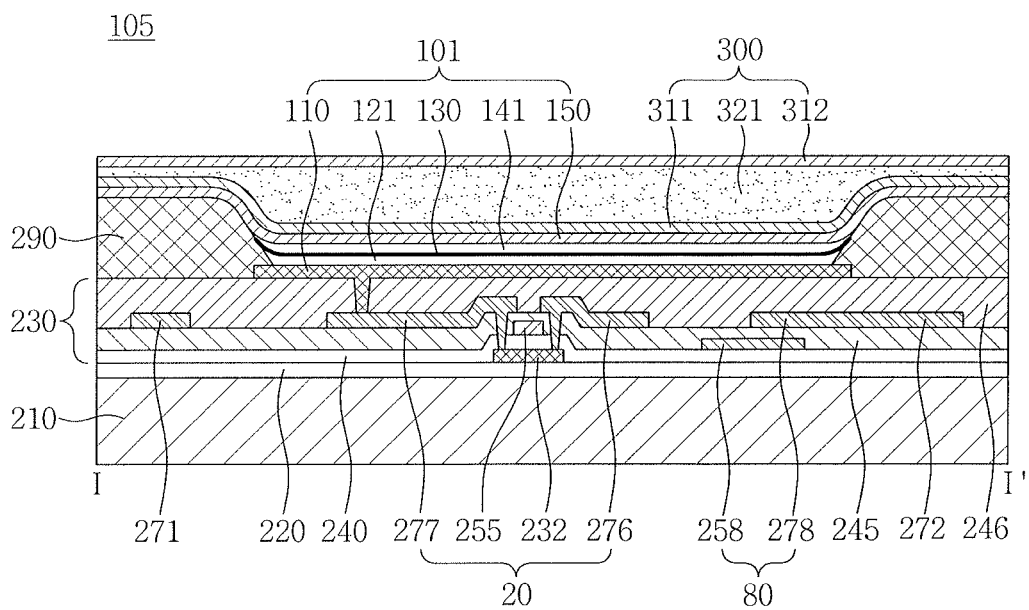
FIG. 9 illustrates a cross-sectional view taken along the line I-I' of FIG. 8.

FIG. 8 is a plan view illustrating an OLED display device according to a fifth example embodiment, and FIG. 9 is a cross-sectional view taken along the line I-I' of FIG. 8.

Referring to FIGS. 8 and 9, an OLED display device 105 according to a fifth example embodiment includes a substrate 210, a buffer layer 220, a driving circuit portion 230, a pixel defining layer 290, the OLED 101, and a thin film encapsulation layer 300.

The substrate 210 may include, for example, an insulating material selected from the group consisting of; glass, quartz, ceramic, plastic, or the like. However, example embodiments are not limited thereto, and the substrate 210 may include, for example, a metallic material such as stainless steel.

The buffer layer 220 may be disposed on the substrate 210 and may include, for example, one or more layers selected from various inorganic layers and organic layers. In an implementation, the buffer layer 220 may be omitted.

The driving circuit portion 230 may be disposed on the buffer layer 220. The driving circuit portion 230 may include a plurality of thin film transistors ("TFTs"), for example, a switching TFT 10 and a driving TFT 20, and drives the OLED 101. Thus, the OLED 101 may emit light according to a driving signal received from the driving circuit portion 230 to display images.

FIGS. 8 and 9 illustrate an active matrix-type OLED (AMOLED) display device 105 having a 2 Tr-1 Cap structure. For example, the 2 Tr-1 Cap structure may include two TFTs, for example, the switching TFT 10 and the driving TFT 20, and one capacitor 80 in each pixel, but the fifth example embodiment is not limited thereto. For example, the OLED display device 105 may include three or more TFTs and two or more capacitors in each pixel, and may have various structures further including additional wirings. Herein, the term "pixel" refers to a smallest unit for displaying images, and the OLED display device 105 displays images using a plurality of pixels.

According to the present example embodiment, each pixel PX includes the switching TFT 10, the driving TFT 20, the capacitor 80, and the OLED 101, and a structure including the switching TFT 10, the driving TFT 20, and the capacitor 80 is collectively called the driving circuit portion 230. In addition, a gate line 251 extending along one direction, and a data line 271 and a common power line 272 insulated from and intersecting the gate line 251 are also provided at the driving circuit portion 230. Each pixel PX may be defined by, for example, the gate line 251, the data line 271, and the common power line 272, in which they become a boundary, but example embodiments are not limited thereto. The pixels PX may be defined by, for example, a pixel defining layer or a black matrix.

The OLED 101 according to the present example embodiment includes a first electrode 110, a first organic layer 121 on the first electrode 110, a mixed layer 130, a second organic layer 141, and a second electrode 150. Holes and electrons are injected into the mixed layer 130 from the first electrode 110 and the second electrode 150 and combined to each other to form exciplex. Light emission occurs when the exciplex falls from an excited state to a ground state. Since the OLED 101 has been described in detail in the first example embodiment, detailed descriptions thereof will be omitted in order to avoid redundancy.

The capacitor 80 includes a pair of capacitor plates 258 and 278, having an insulating interlayer 245 interposed therebetween. In the present example embodiment, the insulating interlayer 245 may be a dielectric element. A capacitance of the capacitor 80 is determined by electric charges accumulated in the capacitor 80 and a voltage across the pair of capacitor plates 258 and 278.

The switching TFT 10 includes a switching semiconductor layer 231, a switching gate electrode 252, a switching source electrode 273, and a switching drain electrode 274. The driving TFT 20 includes a driving semiconductor layer 232, a driving gate electrode 255, a driving source electrode 276, and a driving drain electrode 277. A gate insulating layer 240 is further provided to insulate the semiconductor layers 231 and 232 and the gate electrodes 252 and 255.

The switching TFT 10 may function as a switching element which selects a pixel to perform light emission. The switching gate electrode 252 is connected to the gate line 251, and the switching source electrode 273 is connected to the data line 271. Spaced apart from the switching source electrode 273, the switching drain electrode 274 is connected to one of the capacitor plates, for example, the capacitor plate 258.

The driving TFT 20 applies a driving power, which allows the mixed layer 130 of the OLED 101 in a selected pixel to emit light, to the first electrode 211 which is a pixel electrode. The driving gate electrode 255 is connected to said one capacitor plate 258 that is connected to the switching drain electrode 274. Each of the driving source electrode 276 and the other of the capacitor plates, for example, the capacitor plate 278, is connected to the common power line 272. The driving drain electrode 277 is connected to the first electrode 211, which is a pixel electrode of the OLED 101, through a contact hole defined at a planarization layer 246.

With the structure described above, the switching TFT 10 is driven based on a gate voltage applied to the gate line 251 and serves to transmit a data voltage applied to the data line 271 to the driving TFT 20. A voltage equivalent to a difference between a common voltage applied to the driving TFT 20 from the common power line 272 and the data voltage transmitted by (or from) the switching TFT 10 is stored in the capacitor 80, and a current corresponding to the voltage stored in the capacitor 80 flows to the OLED 101 through the driving TFT 20 such that the OLED 101 may emit light.

In the fifth example embodiment, a first electrode 110 is formed as a reflective layer, and a second electrode 150 is formed as a semi-translucent layer. Accordingly, the light generated in the mixed layer 130 is emitted through the second electrode 150. Thus, the OLED display device 105 according to a fifth example embodiment has a top emission type structure.

The first organic layer 121 is disposed between the first electrode 110 and the mixed layer 130. The second organic layer 141 is disposed between the mixed layer 130 and the second electrode 150.

The pixel defining layer 290 has an opening. The opening of the pixel defining layer 290 exposes a part of the first electrode 110. The first electrode 110, the first organic layer 121, the mixed layer 130, the second organic layer 141, and the second electrode 150 are sequentially stacked at the opening of the pixel defining layer 290. In the present example embodiment, the second electrode 150 is disposed not only at the opening of the pixel defining layer 290 but also on the pixel defining layer 290. In addition, at least one of the first organic layer 121 and the second organic layer 141 may be disposed between the pixel defining layer 290 and the second electrode 150. The OLED 101 generates light in the mixed layer 130 located at the opening of the pixel defining layer 290. In such a manner, the pixel defining layer 290 may define a light emitting region.

A thin film encapsulation layer 300 is disposed on the second electrode 150. The thin film encapsulation layer 300 includes one or more inorganic layers 311 and 312 and one or more organic layers 321. The one or more inorganic layers 311 and 312 may be alternately stacked with the one or more organic layers 321. In the present example embodiment, the inorganic layer 311 is disposed most adjacent to the OLED 101. In FIG. 9, the thin film encapsulation layer 300 is depicted as including two inorganic layers 311 and 312 and one organic layer 321, but example embodiments are not limited thereto. For example, the thin film encapsulation layer 300 may have a structure in which three inorganic layers and two organic layers are alternately stacked.

The inorganic layers 311 and 312 include, for example, one or more inorganic materials of: $Al_2O_3$, $TiO_2$, $ZrO$, $SiO_2$, AlON, AlN, SiON, $Si_3N_4$, ZnO, LiF, $MgF_2$, or $Ta_2O_5$. The inorganic layers 311 and 312 may be formed through methods such as a chemical vapor deposition (CVD) method or an atomic layer deposition (ALD) method. However, the fifth example embodiment is not limited thereto.

The organic layer 321 may include a polymer-based material. Examples of the polymer-based material may include, for example, an acrylic resin, an epoxy resin, polyimide, and polyethylene. The organic layer 321 may be formed through, for example, a thermal deposition process. The thermal deposition process for forming the organic layer 321 may be performed in a range of temperature that may not damage the OLED 101. In addition, the organic layer 321 may be formed through, for example, an inkjet process or a printing process. However, example embodiments are not limited thereto.

Inorganic layers 311 and 312 which have a high density of thin film may substantially prevent or efficiently reduce infiltration of, mostly, moisture or oxygen. Permeation of moisture and oxygen into the OLED 101 may be largely prevented by the inorganic layers 311 and 312.

Moisture and oxygen that have passed through the inorganic layers 311 and 312 may further be blocked by the organic layer 321. The organic layer 321 may have relatively low permeation prevention properties as compared to the inorganic layers 311 and 312. However, the organic layer 321 may also serve as a buffer layer to reduce stress between one of the inorganic layers 311 and 312 and the other of the inorganic layers 311 and 312, in addition to the moisture permeation preventing function. Further, since the organic layer 321 has planarizing characteristics, an uppermost surface of the thin film encapsulation layer 300 may be planarized by the organic layer 321.

The thin film encapsulation layer 300 may have a thickness less than or equal to about 10 μm. Accordingly, an overall thickness of the OLED display device 105 may become significantly small. Such an OLED display device 105 may have excellent flexible characteristics.

Hereinafter, a sixth example embodiment will be described with reference to FIG. 10. The descriptions of the configurations the same as those of the first, second, third, fourth, and fifth example embodiments will be omitted for the sake of convenience of explanation.

Figure 10:
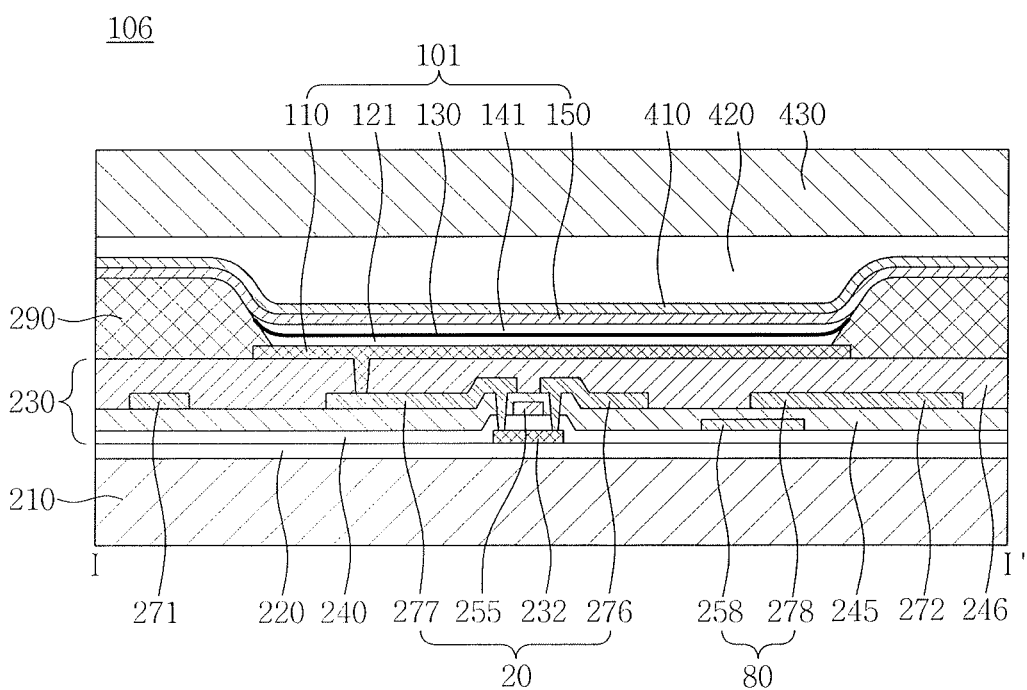
FIG. 10 illustrates a cross-sectional view illustrating an OLED display device according to a sixth example embodiment.

FIG. 10 is a cross-sectional view illustrating an OLED display device according to a sixth example embodiment.

Referring to FIG. 10, an OLED display device 106 according to a sixth example embodiment includes a capping layer 410 on the OLED 101, a filler 420 on the capping layer 410 and an encapsulation substrate 430 on the filler 420.

The encapsulation substrate 430 may be a transparent insulating substrate including, for example, glass, quartz, ceramic, plastic, or the like. The encapsulation substrate 430 is sealingly attached to a substrate 210 to protect the OLED 101.

The filler 420 may include an organic material, for example, a polymer. The filler 420 may have a refractive index greater than or less than a refractive index of the capping layer 410. In another implementation, the filler 420 may have a refractive index substantially equal to a refractive index of the capping layer 410.

The filler 420 may be selected according to the refractive indices of the capping layer 410 and the encapsulation substrate 430. For example, when the encapsulation substrate 430 is a glass substrate having a refractive index of about 1.5, a polymer having a refractive index of about 1.5 may be used as a material included in the filler 420. An example of a material forming the filler 420 may include poly(methyl methacrylate) (PMMA).

The filler 420 may fill a space between the capping layer 410 and the encapsulation substrate 430. Thus, the device strength and durability of the OLED display device 106 may be improved by the filler 420.

By way of summation and review, OLED display devices may have a multi-layered structure including an OLED. An OLED may include two electrodes opposing each other and an organic light emitting layer disposed between the two electrodes. Holes and electrons are injected into the organic light emitting layer from the two electrodes, respectively, and light emission occurs when excitons formed by combination of the injected holes and electrons fall from the excited state to the ground state.

A general light emitting layer, for example, an organic light emitting layer, may include a host and a dopant. Such a light emitting layer may emit light of various colors and extinction of the exciton at a high concentration may be substantially prevented, depending on the kind of the dopant. However, the kind of the dopant suitable for each emission color may be limited.

As set forth hereinabove, according to one or more example embodiments, the OLED may have a simplified structure by emitting light by exciplex. In an example embodiment, an OLED may have a simplified structure that does not include a dopant.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting element, comprising:
a first electrode;
a first organic layer on the first electrode and a second organic layer on the first organic layer, a mixed layer being present between the first organic layer and the second organic layer; and
a second electrode on the second organic layer, wherein:
a gap between a highest occupied molecular orbital (HOMO) energy level of the first organic layer and a lowest unoccupied molecular orbital (LUMO) energy level of the second organic layer is in a range from about 1.35 eV to about 1.70 eV, and
the mixed layer emits light having a wavelength in a range from about 740 nm to about 950 nm by exciplex.

2. The organic light emitting element as claimed in claim 1, wherein the first organic layer, the second organic layer, and the mixed layer do not include a dopant.

3. The organic light emitting element as claimed in claim 1, wherein:
the first organic layer consists essentially of a first organic material,
the second organic layer consists essentially of a second organic material,
the mixed layer consists essentially of the first and second organic materials,
the mixed layer has a concentration gradient so that a concentration value of the second organic material increases along a direction from the first organic layer toward the second organic layer and a concentration value of the first organic material increases along a direction from the second organic layer toward the first organic layer.

4. The organic light emitting element as claimed in claim 1, wherein the first organic layer is a hole transport layer.

5. The organic light emitting element as claimed in claim 1, wherein the first organic layer is a resonance auxiliary layer.

6. The organic light emitting element as claimed in claim 1, further comprising a third organic layer between the first electrode and the first organic layer.

7. The organic light emitting element as claimed in claim 6, wherein the highest occupied molecular orbital energy level of the first organic layer is lower than a highest occupied molecular orbital energy level of the third organic layer.

8. The organic light emitting element as claimed in claim 1, wherein the second organic layer is an electron transport layer.

9. The organic light emitting element as claimed in claim 1, further comprising a fourth organic layer between the second organic layer and the second electrode.

10. The organic light emitting element as claimed in claim 9, wherein the lowest unoccupied molecular orbital energy level of the second organic layer is higher than a lowest unoccupied molecular orbital energy level of the fourth organic layer.

11. An organic light emitting display device, comprising:
a substrate;
a driving circuit portion on the substrate; and
an organic light emitting element on the driving circuit portion,
wherein the organic light emitting element comprises:
a first electrode;
a first organic layer on the first electrode and a second organic layer on the first organic layer, a mixed layer being present between the first organic layer and the second organic layer; and
a second electrode on the second organic layer, wherein:
a gap between a highest occupied molecular orbital energy level of the first organic layer and a lowest unoccupied molecular orbital energy level of the second organic layer is in a range from about 1.35 eV to about 1.70 eV, and
the mixed layer emits light having a wavelength in a range from about 740 nm to about 950 nm by exciplex.

12. The organic light emitting display device as claimed in claim 11, wherein the first organic layer, the second organic layer, and the mixed layer do not include a dopant.

13. The organic light emitting display device as claimed in claim 11, wherein:
the first organic layer consists essentially of a first organic material,
the second organic layer consists essentially of a second organic material,
the mixed layer consists essentially of the first and second organic materials,
the mixed layer has a concentration gradient so that a concentration value of the second organic material increases along a direction from the first organic layer toward the second organic layer and a concentration value of the first organic material increases along a direction from the second organic layer toward the first organic layer.

14. The organic light emitting display device as claimed in claim 11, further comprising a third organic layer between the first electrode and the first organic layer.

15. The organic light emitting display device as claimed in claim 14, wherein the highest occupied molecular orbital energy level of the first organic layer is lower than a highest occupied molecular orbital energy level of the third organic layer.

16. The organic light emitting display device as claimed in claim 11, further comprising a fourth organic layer between the second organic layer and the second electrode.

17. The organic light emitting display device as claimed in claim 16, wherein the lowest unoccupied molecular orbital energy level of the second organic layer is higher than a lowest unoccupied molecular orbital energy level of the fourth organic layer.

18. The organic light emitting display device as claimed in claim 11, wherein the driving circuit portion comprises:
a gate line on the substrate;
a data line crossing the gate line; and
a thin film transistor connected to the gate line and the data line.

19. The organic light emitting display device as claimed in claim 11, further comprising a thin film encapsulation layer on the second electrode,
wherein the thin film encapsulation layer comprises:
at least one inorganic layer; and
at least one organic layer arranged alternately with the at least one inorganic layer.

* * * * *